(12) United States Patent
Vane

(10) Patent No.: US 10,468,236 B2
(45) Date of Patent: Nov. 5, 2019

(54) PLASMA DEVICE WITH AN EXTERNAL RF HOLLOW CATHODE FOR PLASMA CLEANING OF HIGH VACUUM SYSTEMS

(71) Applicant: XEI Scientific, Inc., Redwood City, CA (US)

(72) Inventor: Ronald A. Vane, Redwood City, CA (US)

(73) Assignee: XEI Scienctific, Inc., Redwood City, CA (US)

( * ) Notice: Subject to any disclaimer, the term of this patent is extended or adjusted under 35 U.S.C. 154(b) by 252 days.

(21) Appl. No.: 15/612,232

(22) Filed: Jun. 2, 2017

(65) Prior Publication Data

US 2018/0350564 A1 Dec. 6, 2018

(51) Int. Cl.
*H01J 37/32* (2006.01)
*B08B 7/00* (2006.01)
*B08B 9/08* (2006.01)

(52) U.S. Cl.
CPC ...... *H01J 37/32596* (2013.01); *B08B 7/0035* (2013.01); *B08B 9/08* (2013.01); *H01J 37/32082* (2013.01); *H01J 37/32449* (2013.01); *H01J 37/32467* (2013.01); *H01J 2237/335* (2013.01)

(58) Field of Classification Search
CPC ........................................................ B01J 19/08
USPC .................................................... 156/345.35
See application file for complete search history.

(56) References Cited

U.S. PATENT DOCUMENTS

| 3,627,663 | A | * | 12/1971 | Davidse ................. C23C 14/35 204/192.12 |
| 4,800,281 | A | | 1/1989 | Williamson |
| 4,977,352 | A | | 12/1990 | Williamson |
| 6,105,589 | A | * | 8/2000 | Vane ...................... B08B 7/0035 134/1.1 |
| 6,112,696 | A | | 9/2000 | Gorin |
| 6,424,091 | B1 | * | 7/2002 | Sawada ............. H01J 37/32009 118/723 AN |
| 6,452,315 | B1 | | 9/2002 | Vane |

(Continued)

FOREIGN PATENT DOCUMENTS

WO 2010107722 A1 9/2010

OTHER PUBLICATIONS

European Search Report, Application EP18174141.4, dated Oct. 23, 2018.
Castillo, et al., Low-Pressure DC Air Plasmas. Investigation of Neutral and Ion Chemistry, J. Phys. Chem. A, 2005, 109 (28), pp. 6255-6263 (Jun. 28, 2005).

(Continued)

*Primary Examiner* — Ram N Kackar
(74) *Attorney, Agent, or Firm* — Mark D. Perdue

(57) ABSTRACT

A compact cylindrical vacuum chamber made from a dielectric ceramic or glass wrapped with a cylindrical electrode connected to an RF source make a hollow cathode RF plasma source. The dielectric cylinder is used as the vacuum container with the conductive electrode outside the vacuum region to excite plasma inside. A gas is supplied by a gas source at low flow on one end of the cylinder and after being excited exhausts into a connected vacuum chamber carrying excited metastables and radicals. RF power is applied to the electrode to excite the plasma via the hollow cathode effect. This remote RF plasma source can be used to create ions, electrons, excited metastables, and atomic radicals for use downstream depending on choices of gas, pressure, flow rates, RF power and frequency, and extraction electrodes.

9 Claims, 6 Drawing Sheets

Ceramic Chamber with External Hollow Cathode

(56) References Cited

U.S. PATENT DOCUMENTS

| | | | |
|---|---|---|---|
| 6,610,257 B2 | 8/2003 | Vane | |
| 6,685,803 B2 * | 2/2004 | Lazarovich | B01D 53/326 |
| | | | 204/164 |
| 2003/0007910 A1 | 1/2003 | Lazarovich et al. | |
| 2004/0253828 A1 * | 12/2004 | Ozawa | C23C 16/4405 |
| | | | 438/710 |
| 2005/0033407 A1 * | 2/2005 | Weber | A61F 2/91 |
| | | | 623/1.15 |
| 2006/0054279 A1 * | 3/2006 | Kim | H01L 21/02071 |
| | | | 156/345.33 |
| 2013/0048851 A1 * | 2/2013 | Kumano | H01J 49/0431 |
| | | | 250/282 |
| 2015/0097485 A1 | 4/2015 | Vane | |

OTHER PUBLICATIONS

Corning, Inc., Material Safety Data Sheet Macor (2008).
Han, et al., PIC/MCC Simulation of Radio Frequency Hollow Cathode Discharge in Nitrogen, Plasma Sci. Technol. 2016, vol. 18 Issue (1): 72-78 (2016).
Pickova, et al., Langmuir Probe Measurements in the Hollow Cathode Plasma Jet System, WDS'11 Proceedings of Contributed Papers, Part II, 131-135 (2011).
Plasek et al,, JE 2012, Exploration of RF-controlled high current density Hollow cathode concepts. in 48th AIAA/ASME/SAE/ASEE Joint Propulsion Conference and Exhibit 2012. 48th AIAA/ASME/SAE/ASEE Joint Propulsion Conference and Exhibit 2012 (United States, Jul. 30, 2012).
Soderstrom, Modelling and Applications of the Hollow Cathode Plasma, Doctoral Thesis, Uppsala University, Uppsala, (2008).

* cited by examiner

Ceramic Chamber with External Hollow Cathode

External Hollow Cathode on Flexible power and gas feeds

Ceramic Chamber with External Hollow Cathode

PLASMA DEVICE WITH AN EXTERNAL RF HOLLOW CATHODE FOR PLASMA CLEANING OF HIGH VACUUM SYSTEMS

BACKGROUND OF THE INVENTION

Field of Invention

The present invention relates to an improved device for the plasma generation of oxygen radicals from air for use in cleaning analytical instruments such as scanning microscopes (SEM), scanning electron microprobes, transmission electron microscopes (TEM) and other charged-particle beam instruments that are subject to contamination problems from hydrocarbons. In particular, it relates to apparatus using a radio-frequency-excited hollow cathode (RF-HC) outside a vacuum container to create an excited gas plasma inside the vacuum container so that it becomes a plasma radical source.

Plasmas are used for many processes. Plasma can be used for produce energic ions for sputtering where the bombarding ions are used for etching surfaces by erosion. Sputtering can also transfer material from a target onto a substrate in sputter disposition. Reactive Ion Etching (RIE) is another useful process where the ions chemically react with the target material to remove it. These ion processes are done at higher pressures, including atmospheric pressure, and at high power to produce high densities of ions to do short-range etching. Chemical etching by plasma is done by reactive neutral species in the form of radicals and meta-stables. The species are easily destroyed by collisions and have a short lifetimes at higher pressures. Most plasma chemical etching is done in vacuum. Plasma chemical etch can be done remotely by flowing the reactive neutral species out of the plasma to other areas for chemical etching, cleaning, contamination control. Atmospheric plasmas with ions, electrons, and reactive neutral species can also be used for sterilization and tissue bonding

Summary of the Prior Art

Traditionally, contamination control in vacuum systems such as scanning electron microscopes (SEMs) has focused on pump oils, finger prints, dirty specimens, and improper vacuum practices in manufacturing and operation. The use of dry pumps at all stages of the vacuum system of new field emission (FE) SEMs, and the use of better vacuum practices on the part of users and manufacturers have made environmental hydrocarbons, the hydrocarbon background contamination of our world, a significant source of the remaining hydrocarbons in electron microscope vacuum systems. These environmental sources of hydrocarbons (HC) cause a loss of resolution and contrast in imaging at the highest levels of magnification.

The semiconductor industry and associated nano-sciences have created a demand for instruments that can image structures less than 5 nm in size at less than 2 KV. Instrument manufacturers have responded with field emission (FE) instruments that offer better than 400K$^x$ magnification at high contrast with low KV beams. Control of contamination has become more important as semiconductor manufacturers move to ever smaller dimensions. It is already common to examine features less than 10 nm in size with low KV (<2 KV) that are close to the resolution limits of the instruments. In such cases, the smallest amount of HC in the chamber can cause a loss of resolution and contrast. The electron beam reacts with any stray HC in the beam path or on the surface to create HC ions that then condense and form a hydrocarbon deposit on the area being scanned. Despite dry pumps and liquid nitrogen traps, these artifacts and contamination haze continue to be formed.

Plasma cleaning with an air plasma removes hydrocarbons with a chemical etch where the oxygen in air is disassociated into neutral O radicals (atoms) or metastables. These species react quickly with hydrocarbons to produce $H_2O$, $CO_2$, CO, $H_2CO$, and other short chain volatile hydrocarbons that can be removed by the vacuum pumps. Hydrogen gas can also be used in a plasma for cleaning by reduction of the hydrocarbons. Other frequently used gases include combinations of $N_2$, $O_2$, $H_2$, fluorocarbons, as well as inert dilutant gasses He, Ne, Ar, Ne, and Xe.

The most common method of plasma cleaning is to use an inductively coupled plasma (ICP) remote source or a remote microwave cavity. The ICP uses a radio-frequency-powered (RF) solenoid magnetic field to trap the electrons in the plasma. Because the ICP coil is grounded on one leg, it has low impedance and high current with high heating. The electron energy spread expands due to colliding and circling electrons in the magnetic field without encounters with the sheath. This results in more heating of the gas rather than ionization and disassociation of the molecules.

It is well-known that a solenoid coil can be wrapped around a glass or quartz cylinder and excited with RF power to create an inductively coupled plasma or ICP without the electrode contacting the plasma. The ICP creates a magnetic field within the chamber that traps the free electrons within the coil while they oscillate. U.S. Pat. No. 3,616,461 to Gorin described an ICP electrodeless discharge in 1969. The hollow coil used by ICP magnetic confinement that confines electrons with an oscillating electric field is sometimes confused with an RF-excited hollow cathode (RF-HC).

Capacitive coupling of RF power is another method for exciting a plasma. It is usually associated with parallel plates but is achieved by having two electrodes, an anode and cathode in DC plasmas or in AC or RF applied in opposition on the plates. Often with RF or AC plasma only one electrode needs to be powered as a cathode and grounded surfaces provided the anode for the plasma. Around dielectric tubes, two split rings of opposite polarity can generate a capacitive coupled plasma called a "barrier ring" plasma. This plasma can be confused with Hollow Cathode (HC) plasma but barrier rings come in pairs and feature opposite polarities.

The RF-excited hollow cathode is different from other plasma excitation methods. The hollow cathode is a symmetric chamber, ideally a cylindrical sheath with the same potential on all sides. Electrons inside the plasma are excited at RF frequency to oscillate between sides of the sheath and are accelerated inward only to be turned back by the opposite side of the sheath. This creates an electron trap to maintain the plasma. Electrons are created when molecules are ionized by electron collisions or by secondary electrons when ions hit the walls of the chamber. Electrons in the interior oscillate between the equal potentials of the circular sheath surrounding them The mathematical models for this behavior are discussed in the references Soderstrom, *Modelling and Applications of the Hollow Cathode Plasma*, Digital Summaries of Uppsala Dissertations INSN 16510-6214, IBSN 978-91-554-7206-1; Castillo, et al., *Low-Pressure DC Air Plasmas. Investigation of Neutral and Ion Chemistry*, The Journal Of Physical Chemistry A 109(28): 6255-63, August 2005; and Han, et al., *PIC/MMC Simula-*

*tion of Radio Frequency Hollow Cathode Discharge in Nitrogen*, Plasma Science and Technology, Vol. 18, No. 1, p. 72 January 2016.

Han, et al. developed a two-dimensional PCC/MCC model to simulate the nitrogen radio frequency hollow cathode discharge (RF-HCD) plasma. It was found that both the sheath oscillation heating and secondary electron heating play a role to maintain the RF-HCD plasma under the simulated conditions. The mean energy of ions ($N_2^+$, $N^+$) in the negative glow region is greater than the thermal kinetic energy on the molecular gas ($N_2$) which is an important characteristic of RF-HCD. During the negative portion of the hollow cathode voltage cycle, electrons mainly follow pendulum movement and produce a large number of ionization collisions in the plasma region. The heavier ions are accelerated into the walls and then produce secondary electrons that sustain the plasma. During the positive voltage of the RF cycle, the axial electric field becomes stronger and its direction points to the anode via the axial electric field acceleration. The pendulum motion of the electron through the axis of the hollow cathode makes the axis of the cylinder act like a virtual anode that is at neutral with the RF oscillations of the surrounding cathode driven by the RF source. It has been seen in our laboratory that a hollow cathode will generate and ignite plasma even without any nearby grounded surface except the outside vacuum chamber walls. A grid of holes in a sheet screen can be used as a plasma source electrode by functioning as multiple hollow cathodes.

The cylindrical electrode is a hollow cathode and a cylindrical sheath forms around the inside. Secondary electrons may be emitted from the inner surface of the electrode or from a dielectric surface inside the electrode. The electrons are accelerated into the sheath and then are repelled by the sheath on the opposite side of the cylinder and are trapped to oscillate between the opposite sides of the sheath. These electrons cause a very high level of ionization in the gas and a very dense plasma. In the RF mode this plasma is characterized by a very low impedance, allowing a high effective current flow at relatively modest power levels. The low impedance is also characterized by a low voltage on the electrode.

One of the major differences in RF-HC and other plasmas is that there is considerable electron and ion energy within the plasma due to the pendulum motion of the electrons towards the sheath in two different energy groups, secondary emitted electrons from the outside cylinder accelerated through the sheath and lower energy electrons from ionization inside the plasma.

In the hollow cathode there is a virtual anode on the axis of the cylinder that is neutral in regards to the RF field on the surrounding cathode. Thus there is no physical anode sheath in the center. As shown in the above-referenced papers, modeling the RF-HC plasma shows that high energy ions gather on axis to oscillate at high energy and are slowed down by collisions with molecules, collisions which produce more ions and electrons.

In operation, on both ends of this RF-HC, the plasma sheath extends out like a tongue from the cylinder into the surrounding vacuum. Most of the theory on sheaths has only been on sheaths near surfaces. It is our speculation that the plasma extension tongue is sustained by the projected ions along the axis until the ions are neutralized and run out of energy from collisions with molecules in the vacuum. The distance traveled by these ions will depend on pressure, the mean free path, and the average energy lost per collision.

The surrounding chamber, if conducting, provides the needed reference ground potential but does not interact with the plasma sheath directly.

If a solid surface intersects with the plasma tongue a classic sheath will develop and the ions will collide with the solid surface. At high enough ion energies sputtering can occur on this surface. Sputtering can be avoided if the distance from the solid surface is increased so that the plasma tongue does not form a sheath next to it.

Commonly invented U.S. Pat. Nos. 6,105,589, 6,452,315 and 6,610,252 to Vane describe the RF-HCD remote plasma apparatus and method developed for remote cleaning of scanning electron microscopes using a hollow cathode made from an aluminum screen made by machining or from punched sheet metal. U.S. Pat. No. 6,105,589 describes the cleaning chemistry provided by oxygen radicals produced for downstream plasma cleaning by the described hollow cathode device using medium-sized hollow cathodes in vacuum, rather than allow the radicals to recombine at high pressure such as atmospheric pressure. High vacuum allows the radicals to live longer, rather than recombining. This device was successful but experience with it showed that improvements could be made. The aluminum cylindrical hollow cathode is immersed in the plasma during operation. At low power (<20 Watts RF @13.56 MHz) this created few problems, but at higher power, overheating and electrode erosion occurred and discoloration formed on the interior walls of the plasma source. This suggested material losses from the electrode and its support structure. The RF power was fed through a power feedthrough on the flange which supported the electrode on its axis via a support cross bar. All of these parts were in the prior art plasma radical source, and they displayed erosion damage over long exposure at higher power.

In Fridman et al. (WO 2010/107722) a hollow cathode discharge is used for contacting a biological substrate with a non-thermal plasma discharge. At atmospheric pressure it uses an ignitor electrode (104) inside the plasma chamber to strike and ignite a plasma. The present invention works at vacuum pressures and does not require an ignitor electrode. It uses for ignition a method and apparatus disclosed by Vane in U.S. Patent Publication No. 2015/0097485. When the RF power is turned on, a small pressure rise occurs with the gas flow being turned on, the results in plasma ignition.

SUMMARY OF THE INVENTION

It is a general object of the present invention compared to prior art to modify the plasma source to avoid damaging sputtering inside the chamber and to raise the power of an RF hollow cathode electrode discharge to enable low voltage, high current operation to prevent overheating, erosion of the electrode, and particulate generation. In the present invention several steps are taken to modify the source:
1. Move the hollow cathode electrode outside the vacuum plasma chamber of the instrument.
2. Make the vacuum plasma chamber a cylinder of dielectric insulation material that is resistant to sputtering.
3. Create the conductive electrode as a cylinder around the insulating material.
4. Move the ends of the chamber beyond the ends of the plasma sheath along the axis of the cylinder.
5. Adjust the length of the mean free path by adjusting the operating pressure so that the chamber ends are not touched by the plasma sheath to prevent ion sputtering of the chamber ends.

6. Supply a source of gas to the plasma chamber and have the gas exit into the main vacuum chamber after excitation.

The hollow cathode electrode is mounted around a vacuum chamber made of an insulating dielectric material. This design removes the conductive material of the electrode from contact with ions from the plasma and sheath. The plasma chamber and electrode are then mounted inside an outer grounded shell for electrical safety. The gas exits the plasma chamber at the end of the shell via a vacuum flange into the main chamber of the instrument or tool to be cleaned. The plasma itself inside its sheath is contained mainly inside the cylinder or plasma chamber. The sheath will exhibit a tongue that will extend into the main chamber. The size of the tongue is governed by the applied RF power and the mean free path of the gas in vacuum. With some gases and gas mixtures at low pressures, a flowing afterglow will be exhibited outside the sheath in the chamber. This afterglow is generated by the decay of metastables in the out-flowing gas. With air, the afterglow has a distinct violet color at 386 nm caused by the decay of an $N_2\ \Delta^1$ metastable. This color is often mistakenly described as pink. The atomic oxygen metastable is only weakly visible and is hard to see mixed with $N_2$. Cleaning measurements show the nitrogen afterglow is a marker for the volume being cleaned by oxygen. Because there is no conductive material such as aluminum near the plasma sheath, the production of metal particulates like alumina is suppressed.

In a preferred embodiment of the invention, the reactant gas is air because it is a convenient source of oxygen. Other oxygen gas mixtures and pure oxygen can be used or reducing gas can be used. These mixtures can contain hydrogen, water vapor, He, Ar, Ne, F and compounds thereof. For cleaning by reduction $H_2$ and ammonia could be used. The requirement is that reactions with the contaminant produce a volatile compound that can be removed by the pumps when the contamination reacts with plasma activated radicals or metastables.

With an exterior hollow cathode, the dielectric cylinder will partially enclose and define the plasma sheath, which will make a cylindrical shape inside. Ions will create secondary electrons when they collide with the dielectric material and the expelled ions will be accelerated into the plasma by the sheath. Inside the plasma the high energy ions are very effective in ionization and disassociation of the gas molecules.

Figure 1A:
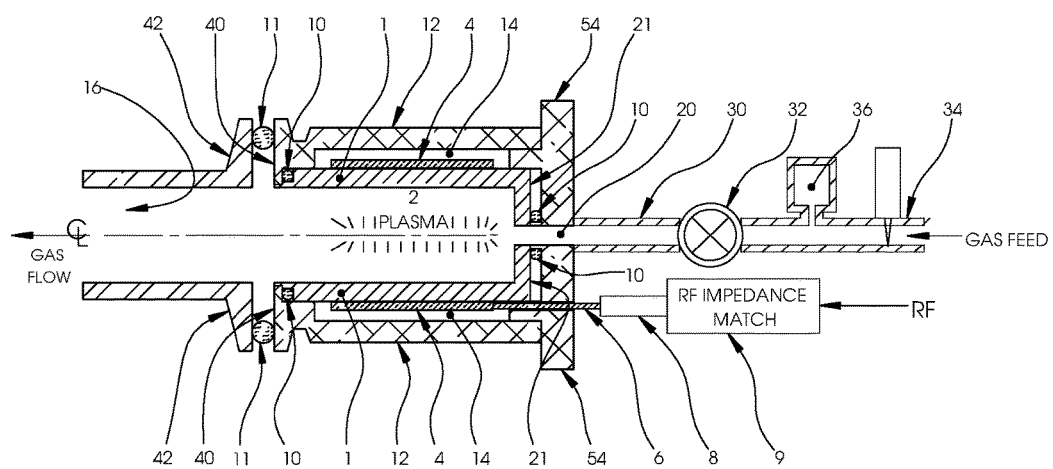
FIG. 1A is a longitudinal section view of an embodiment of the present invention

| Reference Numerals in Drawings | |
|---|---|
| dielectric cylinder or tube | 1 |
| plasma | 2 |

| Reference Numerals in Drawings | |
|---|---|
| hollow cathode electrode | 4 |
| center conductor | 6 |
| coaxial cable | 8 |
| RF impedance match | 9 |
| vacuum seal o-rings | 10 |
| KF flange O-ring | 11 |
| conductive grounded shield | 12 |
| insulator | 14 |
| activated gas | 16 |
| gas entrance hole | 20 |
| tube end wall | 21 |
| metal welded or brazed seal | 22 |
| metal ring or tube connected to seal | 24 |
| vacuum feedthrough | 26 |
| flexible gas tube | 28 |
| manifold | 30 |
| on/off valve | 32 |
| gas control device | 34 |
| gas ballast | 36 |
| chamber exit flange | 40 |
| connector flange | 42 |
| sealing CF joint with knife edge | 50 |
| rotating ring | 52 |
| baseplate | 54 |
| copper ring | 55 |
| CF connector flange | 56 |

DETAILED DESCRIPTION OF THE INVENTION

Figure 1B:
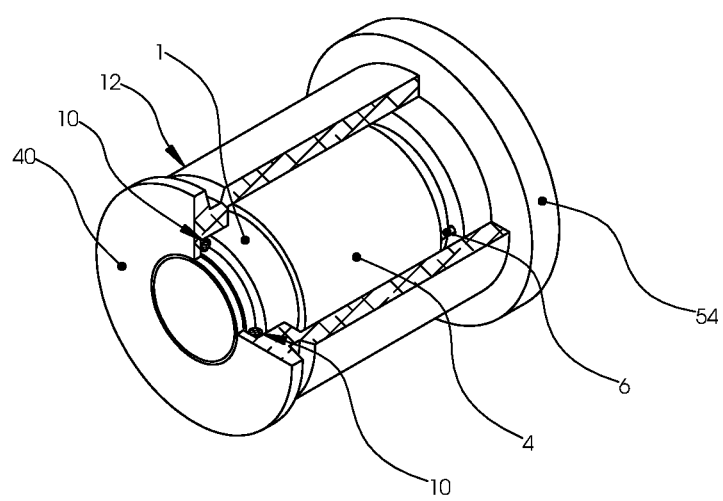
FIG. 1B is a perspective view, partially in section, of the embodiment of FIG. 1A.

Referring now to the Figures and in particular to FIGS. 1A and 1B, a first embodiment of the plasma device according to the present invention comprises a hollow cylinder 1 made of a dielectric material such as the machinable ceramic composed of about 55% fluorophlogopite mica and 45% borosilicate glass and sold under the trademark Macor® by Corning Incorporated, Houghton Park CB-08, Corning, N.Y. 14831. Cylinder 1 is in fluid communication at its downstream end with the vacuum chamber of an instrument and thus is itself under vacuum conditions and is used to contain a plasma 2 in a plasma chamber defined in the interior of the cylinder 1. Other dielectric materials such glass, quartz, Teflon, and other ceramics were tested and it was found that they did not produce as dense a plasma as the Macor® ceramic (see discussion in connection with FIG. 4, below). While Macor® ceramic material provided unexpectedly good results, the other materials listed above, as well as other dielectric materials, may also be suitable for use in the present invention.

A hollow cathode electrode 4, made from a conductive material such as brass, is placed around and in close contact with cylinder 1. Electrode 4 may be a machined cylinder that is placed around the exterior of cylinder 1 or a thin sheet of conductor wrapped around cylinder 1. Electrode 4 may also be "assembled" of halves or quarters machined or otherwise formed from electrically conductive metals or other conductive materials that are closely joined together, electrically, physically, or structurally, upon assembly to form a single, unitary electrode. Electrode 4 is intended to be a continuous thin conductive cylinder, as distinguished from a coil or other interrupted structure, to avoid inductive coupling effects. Other conductive materials such as aluminum or copper could also be used for the electrode. As illustrated in FIGS. 1A through 3, electrode 4 is generally coextensive with the exterior of cylinder 1, leaving only the ends of the cylinder (where electrode effects on plasma are negligible)

uncovered by the conductive material. The electrode 4 is connected to the center conductor 6 of a 50-Ohm coaxial cable 8 that carries radio-frequency (RF) power (~3 KHz to 300 GHz) to the electrode from an RF impedance matching network 9.

A cylindrical, electrically conductive shield 12 is placed around the electrode 4 and is electrically grounded. Vacuum seal O-rings 10 are used so that the plasma chamber 2 is under vacuum and the electrode 4 is at atmospheric pressure. Shield 12 is grounded by a connection to the shield of the RF cable 8 (not shown). The shield also provides an RF ground for the plasma 2 by being in contact with ceramic cylinder 1 on either of the ends extending beyond the electrode insulation 14. An insulator 14 in the form of an air gap (as shown), or solid dielectric material, separates electrode 4 from shield 12. Between the O-rings 10 and the electrode 4, the grounded cylinder 12 may make contact with cylinder 1.

In this embodiment, an upstream end of cylinder 1 has a gas entrance aperture or hole 20 through an end wall 21 in communication with a source or supply of gas to supply the feed or reactant gas to the interior of cylinder 1 to generate and maintain a plasma. End wall 21 should be placed by empirical design away from the intense (brightest) plasma 2 region inside the hollow cathode of cylinder 1 to avoid ion bombardment damage to the end wall.

The feed gas is fed through a gas manifold 30 that contains an on/off valve 32 to control the entrance of gas into chamber 2 and a device for controlling the gas flow or leak rate to and through aperture 20. The leak rate of gas through aperture 20 into the interior of cylinder 1 may be a fixed rate through a gas rate control device 34, such as an orifice or a variable opening or needle or other metering valve that may be controlled manually, or may be varied by a feedback method that uses pressure, plasma density, optical spectra, reaction rate, current, or other physical properties of the plasma to adjust flow. The gas feed pressure to the rate control device 34 is at atmospheric pressure or an otherwise controlled higher pressure. A volume of gas called the gas ballast 36 exists in the manifold tube between valves 32 and 36 that rises to the input pressure when gas is not flowing (valve 32 is closed) and drops suddenly when valve 32 is opened, causing a short-duration gas pressure burst downstream in plasma chamber 2, which assists in igniting a plasma. This gas burst technique follows the disclosures of Vane in U.S. Patent Publication 2015-0097485 and Williamson in U.S. Pat. Nos. 4,800,282 and 4,977,353.

An exit end 40 of the plasma chamber 2 is attached to a connector flange 42 that connects to the main vacuum chamber of the instrument. Typically, KF (or QF) clamp flanges are used with an O-ring 11 mounted on a centering ring (not shown). The activated gas particles 16 from the plasma chamber 2 flow into the connected main vacuum chamber to clean it or accomplish other downstream processes.

In the preferred embodiments, a fixed-flow-rate orifice is used as a gas flow-rate control device 34. Experiments have shown that cleaning at the pressures achieved by turbomolecular pumps (TMP), acting on instrument vacuum chambers in the range of between 1 milliTorr and 30 milliTor, provides satisfactory cleaning rates, and that the flow rate into the plasma chamber of reactant gas is more important than the measured pressure. Thus, a fixed flow rate of 5 to 40 standard cubic centimeters per minute (sccm) satisfies and maintains these conditions both for generation of plasma and flow of and cleaning with the plasma subsequent to generation. By providing fixed input gas flow rate to any TMP system, a plasma can usually be ignited by an RF-Hollow Cathode described in this invention regardless of the pumping speed except in extreme cases.

Figure 2:
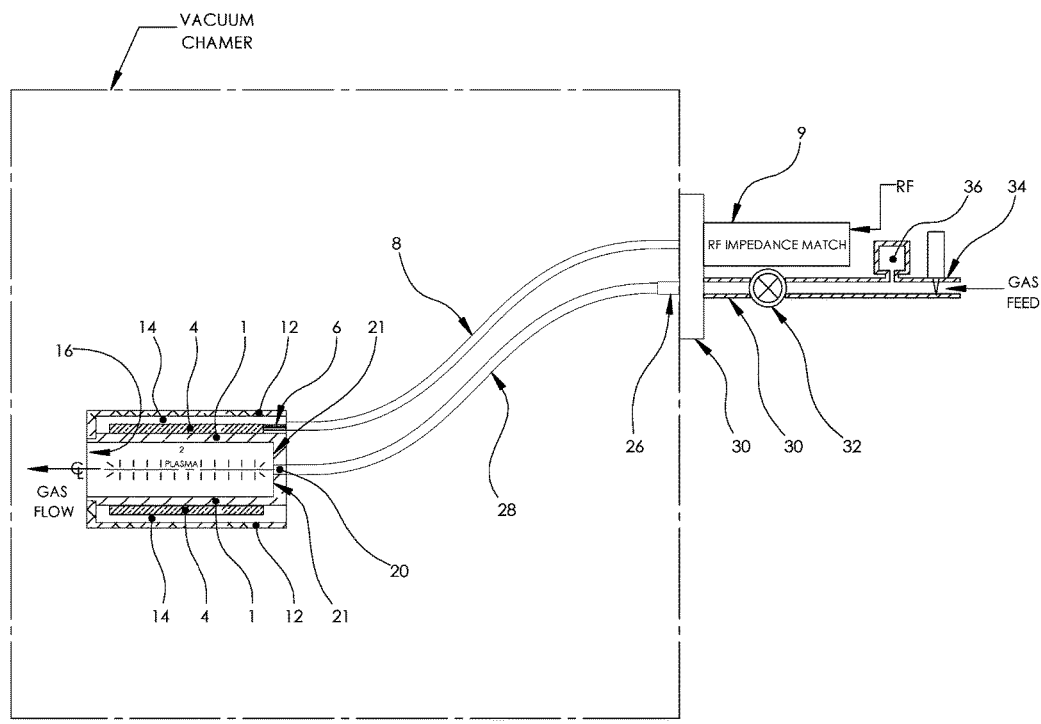
FIG. 2 is a perspective view of another embodiment of the present invention.

FIG. 2 depicts a second embodiment of the invention that differs from that of FIGS. 1A and 1B in that a flexible dielectric tube 28 is connected to one end of the cylinder 1 through the hole 20 in the wall 21 to supply the feed or reactant gas to the interior or plasma chamber within cylinder 1. This embodiment is otherwise similar to that of FIGS. 1A and 1B but is placed inside a larger vacuum chamber. The gas supply and manifold are fed in from outside the main vacuum chamber.

The flexible gas tube 28 is connected through a vacuum feedthrough 26 to a gas control manifold 30 outside the vacuum chamber. The gas control manifold 30 has a gas on/off valve 32 and a device 34 to control gas flow rate into the chamber. Device 34 may be either an aperture or a gas flow control valve. A gas ballast 36 is located in the tube between the two valves 32 and 34 and serves to assist in igniting a plasma. By being on a flexible tube 28 and RF cable 8 tether, this embodiment may be placed anywhere in the vacuum system where plasma cleaning or carbon removal is needed.

Figure 3A:
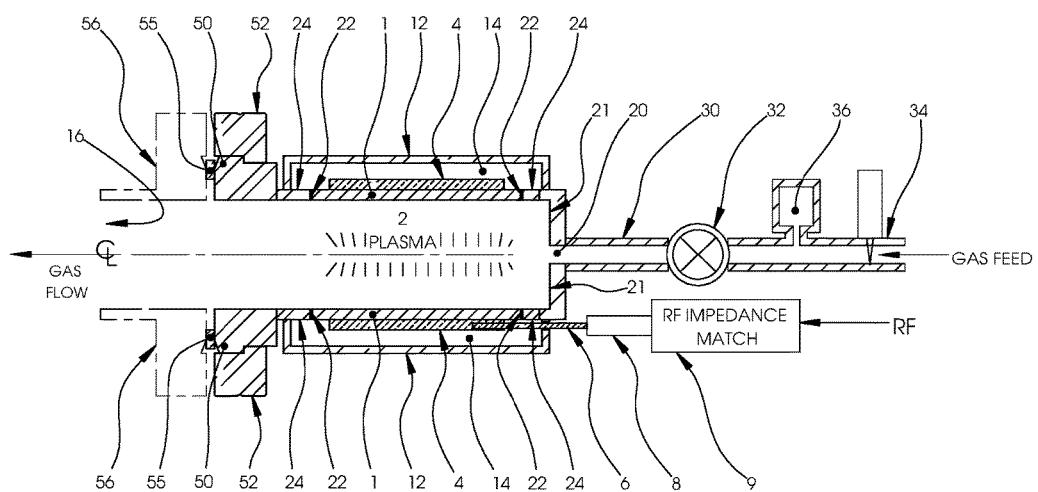
FIG. 3A is a longitudinal section view of still another embodiment of the present invention.
Figure 3B:
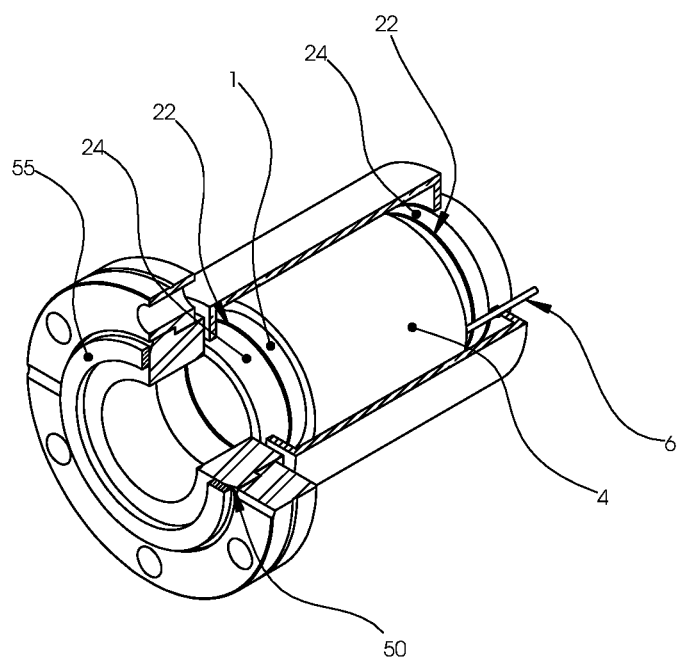
FIG. 3B is a perspective view, partially in section, of the embodiment of FIG. 3A.

FIGS. 3A and 3B illustrate a third embodiment of the invention in which the downstream end of cylinder 1 is sealed to a stainless steel or other metal tube or ring 50 that can be welded or brazed 22 to be made part of a ultra-high vacuum apparatus with all-metal seals or welds. No Viton or other elastomer vacuum seals are needed and the resulting apparatus can be "baked" or exposed to high temperature.

Dielectric plasma cylinder 1 can be welded or brazed 22 to metal ring 24 and connected by flanges that allow a metal-to-metal seal for an ultra-high vacuum connection to the rest of the vacuum system with metal gaskets such as knife-edge copper gaskets 55. CF or ConFlat® (trademark of Agilent Technologies, Inc., 5301 Stevens Creek Boulevard, Santa Clara, Calif. 95051) knife-edge copper-gasket-sealed flanges are preferred. Sealing ring 50 is connected by a metal ring 24 and braze seal 22 to cylinder 1. Sealing ring 50 is compressed by a rotating bolt ring 52. At the upstream or gas-entrance end of tube 1, a metal ring 24 is welded or brazed 22 to cylinder 1. The gas feed entrance 20 may be located at any location on the baseplate 54 but the gas will be fed into the most intense portion of the plasma if it is in the center, to feed on the central axis of the plasma chamber 1. A ground shield 12 is located between the baseplate 54 and rotating ring 52. The electrode 4 and the ground shield 12 are isolated from each other by an insulator 14. The gas feed and RF inputs are described in the first embodiment FIG. 1 and the other figure numbers correspond. The RF electrode on the outside 14 and ground shield 12 can be removable half shells and surround the dielectric tube plasma chamber and electrode, respectively. The RF connection 6 with cable 8 should be a simple pin type to allow the RF cable to be removed. The valve 32 must have metal seals and be bakeable. The rest of the gas manifold and connections can be attached to valve 32 via a metal swage seal fitting or a copper gasket connector.

Figure 4:
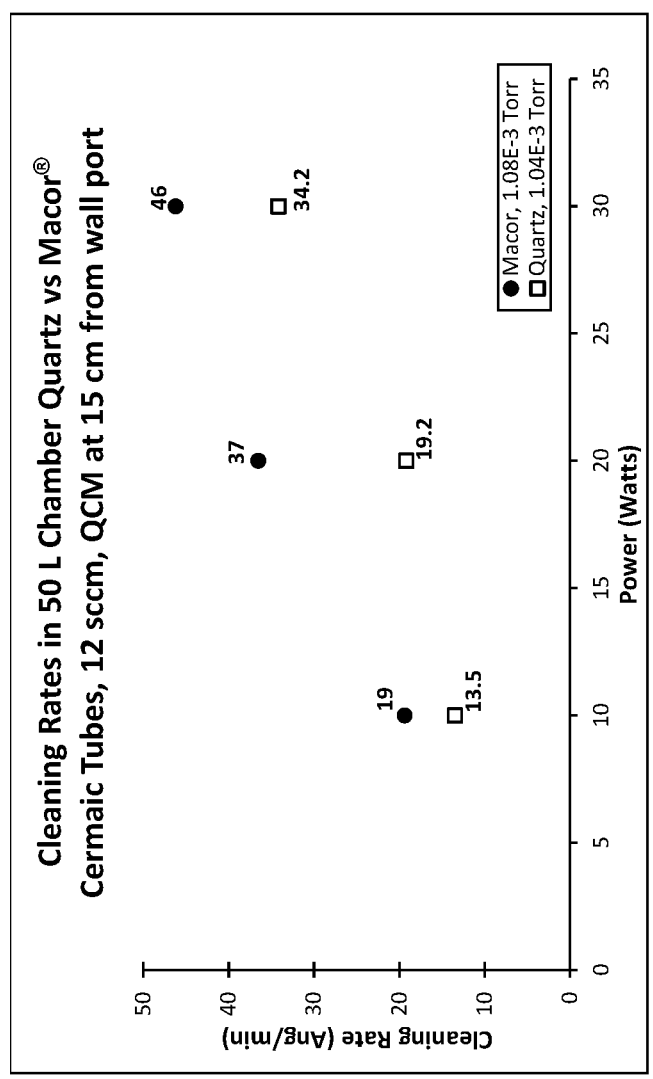
FIG. 4 is a graphical comparison of data showing that Macor® ceramic produces a denser plasma than quartz when it is used as the dielectric cylinder 1.

FIG. 4 is a comparison of plasma density as measured by hydrocarbon removal rates with air plasma made in a quartz tube versus a Macor® tube as the dielectric 1 tube inside the external hollow cathode 4. Measurements were made in a 50 L vacuum chamber, using a quartz crystal monitor or microbalance (QCM) to measure deposition rates at 15 cm from the wall port (25 cm from the plasma source). Chamber pressure (in the 50 L vacuum chamber and interior of cylinder 1) during plasma operations was $1.06 \times 10^{-3}$ Torr, and the flow rate through cylinder 1 was 12 sccm. RF power was as marked on the graph. The most resistant material to sputtering was found in Macor® machinable ceramic made by Corning Inc. Quartz has been used in plasma chambers for ICP type plasma sources to separate the plasma from the electrode. We found that hollow cathode plasma at 50 Watts tended to damage a quartz tube and create a white powder in the chamber. The Macor® ceramic tube showed no such damage after a longer exposure. In addition, Macor® ceramic emits more secondary electrons than quartz. This allows a Macor® tube to sustain a higher density plasma than a quartz tube, resulting in a higher cleaning rate. While Macor® ceramic exhibits unexpected results in the cylinder of the cathode of the invention, other dielectric materials are suitable for, and within the scope of, the present invention.

In the development of the first embodiment of the invention it was observed that no significant plasma self-bias voltage could be observed between the RF hollow cathode 4 and the chamber ground 12. Because there is no conductive plasma path between the two due to the dielectric cylinder 1 inside the anode, this was not surprising, but it indicates a significant unusual property of the invention. The plasma oscillates about a virtual ground anode on the axis of the hollow cathode assembly 1, 4 and does not need a physical ground anode in contact with plasma to support a discharge. The plasma discharge sheath from said device cylinder is not described in standard texts and reference papers about plasmas. The references ignore the topic of no definable sheath width without a solid surface nearby.

The invention has been described in connection with preferred and illustrative embodiments thereof. It is thus not limited, but is susceptible to variation and modification without departing from the scope and spirit of the invention, which is defined in the appended claims.

I claim:

1. A device for the production of plasma comprising:
   a hollow cylinder formed of a dielectric material, the cylinder having an exterior and an interior, and an upstream end closed by an end wall formed of the dielectric material, wherein the interior is devoid of objects other than the gas;
   a source of gas in fluid communication with the interior of the hollow cylinder through a gas flow control device coupled to an aperture in the end wall of the hollow cylinder;
   a single cylindrical electrode formed of conducting material and surrounding, and generally coextensive with the exterior of the cylinder, the electrode in communication with a source of radio-frequency electrical power, wherein, upon energizing the electrode with radio-frequency electric power and passage of gas through the cylinder, a plasma is formed by radio-frequency, hollow cathode effect coupling inside the dielectric cylinder to generate reactive neutral species;
   a grounded shield surrounding and enclosing the single cylindrical electrode and electrically insulated therefrom; and
   a vacuum chamber in communication with a downstream end of the hollow cylinder and through which the plasma passes to effect cleaning of the chamber.

2. The device of claim 1, wherein the cylinder is formed of a material comprising about 55% fluorophlogopite mica and 45% borosilicate glass.

3. The device of claim 1, wherein the vacuum chamber is in a charged-particle-beam instrument and the reactive neutral species are used to clean the vacuum chamber.

4. The device of claim 3, wherein the gas is air and the vacuum chamber is cleaned by Oxygen radicals that are the neutral specie that remove carbon compounds by oxidation from the vacuum chamber, but do not oxidize the conducting material of the electrode.

5. The device of claim 1, wherein the gas is hydrogen.

6. The device of claim 1, wherein a virtual anode is formed by a hollow cathode effect along a central axis of the cylinder in the plasma and an electrical ground is defined by the vacuum chamber walls.

7. The device of claim 1, wherein the cylindrical electrode is a brass cylinder extending around the exterior of the hollow cylinder.

8. The device of claim 1, wherein the gas flow control device is a variable valve.

9. The device of claim 1, wherein the cylinder is formed of a material comprising fluorophlogopite mica and borosilicate glass.

* * * * *